United States Patent [19]
Dennard et al.

[11] 3,949,381
[45] Apr. 6, 1976

[54] DIFFERENTIAL CHARGE TRANSFER SENSE AMPLIFIER

[75] Inventors: Robert H. Dennard, Croton-on-Hudson; Dominic P. Spampinato, Ozone Park, both of N.Y.

[73] Assignee: International Business Machines Corporation, Armonk, N.Y.

[22] Filed: July 23, 1974

[21] Appl. No.: 491,023

[52] U.S. Cl. .......... 340/173 CA; 307/238; 307/279; 307/291; 340/173 FF
[51] Int. Cl.$^2$ ..................... G11C 7/06; G11C 11/24
[58] Field of Search..... 340/173 CA:173 R, 173 FF; 307/246, 279, 291, 238

[56] References Cited
UNITED STATES PATENTS

| | | | |
|---|---|---|---|
| 3,760,381 | 9/1973 | Yao................................ | 340/173 R |
| 3,771,147 | 11/1973 | Boll et al...................... | 340/173 CA |
| 3,774,176 | 11/1973 | Stein et al..................... | 340/173 FF |

*Primary Examiner*—Stuart N. Hecker
*Attorney, Agent, or Firm*—John J. Goodwin

[57] ABSTRACT

A differential charge transfer amplifier which functions as a sensing and regenerating circuit responsive to binary information represented by the level of charge in a stored charge memory cell is disclosed. The sense amplifier includes a pair of dummy cells and bucket brigade amplifiers which are connected on either side of a dynamic latching circuit which includes a plurality of actuable gate devices, which may be field effect transistors. A bit/sense line of the array is divided into two equal sections which are respectively connected to either side of the sense amplifier. The operation of the amplifier is cyclic, including a precharge period, a sensing period, a rewrite period and a restore period, after which the amplifier is in its original state. A feature of the amplifier is that it consumes no d.c. power other than leakage and has high sensitivity due to a charge transfer feature. Also, during the operation of the circuit, energy remaining in one of the bit line sections after rewriting is utilized to pre-bias both bit line sections to an initial level. As a result, this allows better control of the precharge level on the bit/sense line and in so doing, the power requirements are substantially reduced. At the same time, a dummy cell is charged to the potential of the now balanced bit lines.

7 Claims, 2 Drawing Figures

3,949,381

DIFFERENTIAL CHARGE TRANSFER SENSE AMPLIFIER

BACKGROUND OF THE INVENTION

1. Field of the Invention

The present invention relates to circuits for the detection of signals from memory devices wherein binary information is represented by the level of charge, and, more particularly, relates to an improved differential charge transfer sense amplifier circuit.

2. Prior Art

U.S. Patent No. 3,760,381 entitled "Stored Charge Memory," issued Sept. 18, 1973 to Y. L. Yao and assigned to the present assignee shows a sensing circuit arrangement which is similar to the present invention. The patent discloses a differential amplifier or latch arrangement which incorporates the charging up of bit line capacitance of two halves of a bit line to a given value of voltage. The present invention is distinct over the prior art in that it incorporates a special dynamic latching circuit and uses a field effect transistor device across the latch nodes.

Other known prior art references include U.S. Pat. Nos. 3,514,765 and 3,541,530 and an article entitled "Storage Array and Sense/Refresh Circuits for Single Transistor Memory Cells," by K. U. Stein et al, 1973 IEEE International Solid-State Circuits Conference, February, 1973. These references are distinct from the present invention for the aforesaid reason and also because the sense amplifier described herein uses the energy available during the initial cycles in order to provide reduced power requirement. This feature is not found in the prior art references.

SUMMARY OF THE INVENTION

The circuit of the present invention in its broadest aspect relates to a sense amplifier for sensing the charge condition of at least a selected one of a plurality of memory devices in a memory array. Memory cells in the array store information in the form of charge and are connected to pairs of bit line elements. The amplifier circuit includes a latch function and has first and second terminals responsive to differences in voltage at the terminals. The circuit of the present invention provides a power improvement in that it eliminates d.c. power consumption which is the major source of dissipation in prior art designs.

Accordingly, it is an object of the present invention to provide a sense amplifier circuit for memory arrays which provides a substantial reduction in power consumption.

Another object of the present invention is to provide a sense amplifier which is highly sensitive.

Still another object of the present invention is to provide a sense amplifier which dissipates no d.c. power, uses a pulsed mode of operation, and requires no load devices.

A further object of the present invention is to provide a balanced sense amplifier adapted to utilize energy which is made available during an initial charging cycle.

The foregoing and other objects, features and advantages of the invention will be apparent from the following more particular description of a preferred embodiment of the invention, as illustrated in the accompanying drawings.

DESCRIPTION OF A PREFERRED EMBODIMENT

Stored charge memory cells, when connected in arrays, are attractive elements for semiconductor memories because of their small cell area and relatively simple structure. However, one of the major design difficulties lies in the signal detection because of the severe attenuation of the stored signal during a read operation when the stored charge redistributes between the cell storage capacitance and the comparatively large bit/sense line capacitance. As a result, unless very sensitive sense amplifiers are used, storage capacitances must be large, thus increasing the cell area.

Another factor in the operation of stored charge memory cell arrays is power consumption, and it is very desirable to provide a sense amplifier with low power requirements.

Figure 1:
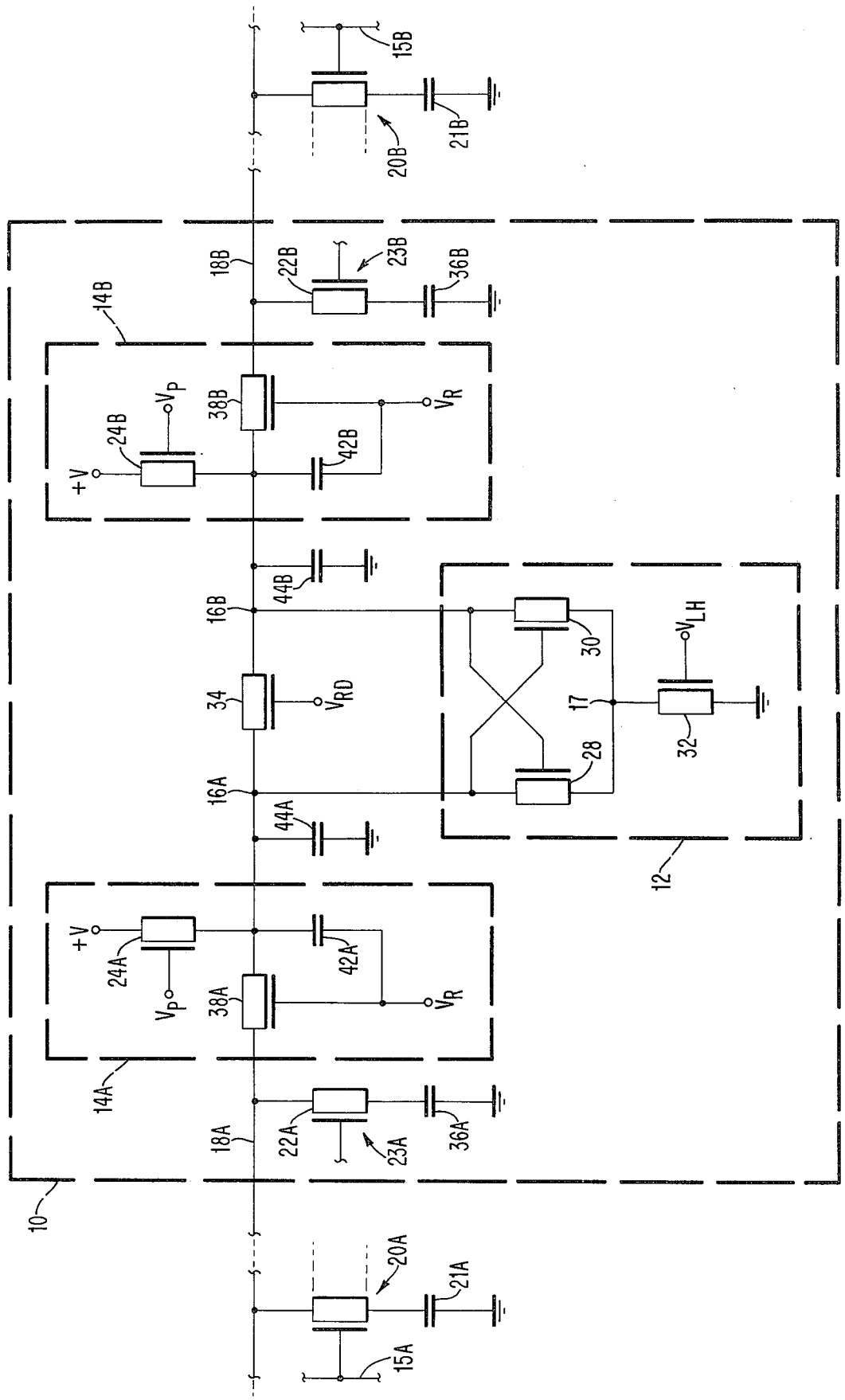
FIG. 1 is a partial schematic, partial block diagram of a charge storage memory array including a sense amplifier according to the principles of the present invention.

FIG. 1 shows an embodiment of a very sensitive sense amplifier which permits the detection of a much smaller amount of charge than other known techniques and also provides a power improvement, as it eliminates d.c. power consumption which is a major source of dissipation in existing designs.

Referring to FIG. 1, the differential sense amplifier 10 is shown including a dynamic latching circuit 12 interconnected between bucket-brigade amplifier arrangements 14A and 14B which are used for preamplification on both sides of the dynamic latching circuit 12. The bucket brigade amplifiers 14A and 14B which are respectively connected to terminals 16A and 16B of latching circuit 12 are also connected respectively through equal bit/sense line segments 18A and 18B to typical stored charge memory cells 20A and 20B. An example of stored charge memory cells 20A and 20B and their associated word lines 15A and 15B are shown and described in the aforementioned U.S. Pat. No. 3,760,381. Two dummy cells 23A and 23B are also provided and are additional to and identical to memory cells 20A and 20B and the other memory cells along the bit line in the memory array.

The dummy cells 23A and 23B consist of actuable device 22A and capacitor 36A and actuable devices 22B and 36B, respectively. Devices 22A and 22B are connected to bit/sense line segments 18A and 18B and to capacitors 36A and 36B. Dummy cells 23A and 23B are used to establish reference levels for setting dynamic latching circuit 12.

The bucket brigade amplifiers 14A and 14B each include actuable devices 24A, 38A, capacitor 42A, and actuable devices 24B and 38B, respectively.

The dynamic latching circuit 12 includes an array of actuable devices 28, 30, and 32, which may be field effect transistors.

A source of precharge signal Vp is connected to the gate electrodes of actuable devices 24A and 24B and it is used to precharge the sense lines. Voltage Vp is obtained from an independent pulse source not shown.

Figure 2:
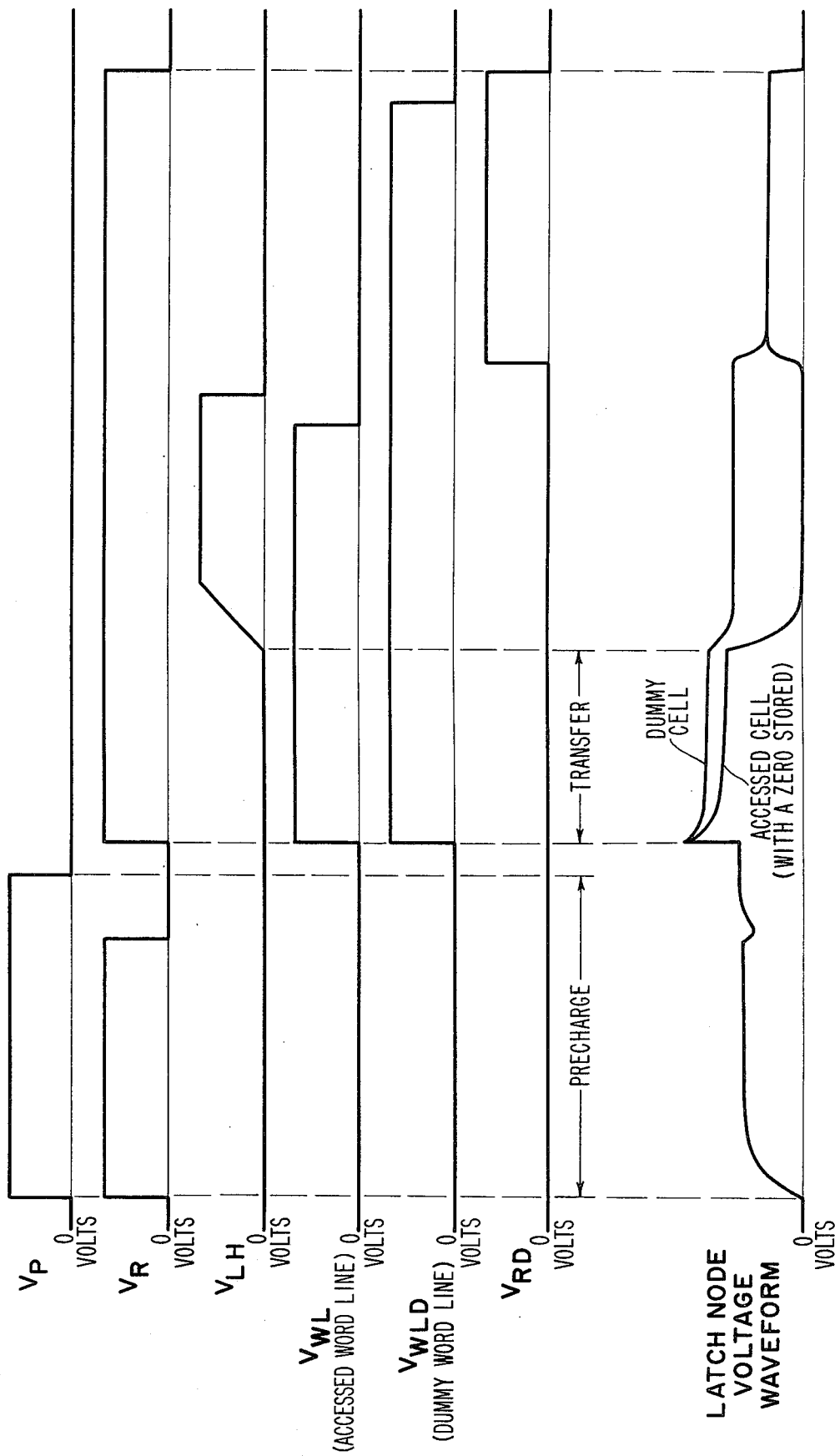
FIG. 2 is an illustration of the pulsing sequence for the circuit of FIG. 1.

A source of redistribution voltage $V_{RD}$ is connected to the gate electrode of actuable device 34, a source of reference voltage $V_R$ is connected to the gate electrodes of actuable devices 38A and 38B, and a source of ramp voltage $V_{LH}$ is connected to the gate electrode of actuable device 32. The voltage sources for $V_{RD}$, $V_R$ and $V_{LH}$ are not shown in FIG. 1. FIG. 2 shows the waveforms for the aforesaid voltages as well as the accessed word line voltage $V_{WL}$, the dummy word line voltage $V_{WLD}$, and the voltage at the nodes 16A and 16B of the dynamic latching circuit 12.

The sequence of operation of the sense amplifier 10 of FIG. 1 and as depicted in FIG. 2 is as follows. Precharge voltage Vp and reference level voltage $V_R$ are applied to and turn on actuable precharge devices 24A, 24B and actuable transfer devices 38A, 38B to start the precharge period. This causes (positive) charge to be applied to the bit/sense lines through actuable devices 24A and 38A and 24B and 38B until actuable devices 38A and 38B are close to being cutoff. The potential to which the bit/sense lines are charged is determined by $V_R$ and then $V_R$ returns to ground level thereby assuring that actuable devices 38A and 38B are off. At the same time, charge redistribution takes place between capacitors 42A and 44A and 42B and 44B (44A and 44B being stray node capacitance), thus lowering the voltage at nodes 16A and 16B (see the latch node voltage waveform of FIG. 2). Since actuable precharge devices 24A and 24B are still on due to Vp being present, they will replenish or recharge the node voltage to its original level. Precharge voltage Vp then goes off and therefore actuable devices 24 and 26 go off and the precharge period ends with the bit/sense lines 18A and 18B charged and transfer devices 38A and 38B are off.

The read period starts by reference voltage $V_R$ going on which again places actuable devices 38A and 38B back to their previous close-to-cutoff state. In so doing, the node voltage at nodes 16A and 16B rises due to charge redistribution across capacitors 42A, 44A and 42B, 44B. An accessed word line and a dummy word line associated with the bit/sense line on the side of sense amplifier circuit 10 opposite to that accessed are activated. The dummy cell is an additional bit per bit/sense line and has a stored potential half way between the two voltage levels used to represent binary information in the regular memory cells. It is required to establish the necessary reference level for setting the latching circuit 12.

It is assumed in this explanation that memory cell 20A is to be accessed and that no charge ("0") is stored on the storage capacitor 21A of the accessed cell 20A. When the accessed word line of cell 20A is activated, charge flows from the distributed bit/sense line capacitance to the storage capacitance 21 of accessed memory cell 20A causing the potential across storage capacitor 21 to increase and the potential on bit sense line 18A to decrease. This drop in potential on the bit/sense line causes the charge transfer device 38A to turn on more.

Since the potential at node 16A is greater than the potential on bit/sense line 18A, charge flows from node 16A to bit/sense line 18A until charge transfer device 38A reaches its close-to-cutoff state again. The charge lost at node 16A is essentially the charge gained by the accessed memory cell storage capacitor 21A, since there is no net change in charge on the distributed bit/sense line capacitance. Therefore the potential drop (due to the lost charge) at node 16A is equal to the potential increase (across the accessed memory cell storage capacitor) multiplied by the ratio of the memory cell storage capacitance 21A to capacitance at node 16A.

If the capacitance at node 16A is kept at a reasonable value with respect to the storage capacitance 21A (i.e. two to three times), then a sense signal initially developed on the bit/sense line 18A, which is small because the bit/sense line capacitance is often much, much larger than the storage capacitance, is translated into a large signal at node 16A. This is an important charge transfer feature of the present invention. Device 38A is assured of attaining its desired close-to-cutoff state as long as the potential at node 16A is greater than the potential on bit/sense line 18A. The aforesaid process is repeated on the opposite bit/sense line 18B where a dummy cell 23B has been activated. Since dummy cell 23B is half filled with charge its respective node potential 23B, namely 16B, will drop half as much. This is illustrated by the two latch node voltage curves in FIG. 2.

With a relatively large differential signal developed at the latch nodes 16A and 16B the $V_{LH}$ line connected to device 32 is activated thereby turning on device 32. Device 32 is turned on slowly ($V_{LH}$ is a ramp as seen in FIG. 2) discharging the capacitance at drain node 17. As the potential at drain node 17 decreases, a point will be reached where device 28 turns on since its gate potential (node 16B) is higher than the gate potential (node 16A) of device 30. With device 28 on node 16A starts to discharge (through devices 28 and 32) and when its potential drops below the bit/sense line 18A potential then the bit/sense line 18A starts to discharge (through devices 38A, 28 and 32).

If the discharge rate as determined by the ramp voltage ($V_{LH}$) is such that the potential at node 16A follows the potential at node 17 by less than the threshold voltage of device 30, then device 30 will never turn on. Bit/sense line 18A (and the memory cell storage capacitor) will discharge fully to ground potential. The dynamic latching circuit 12 has now been set without consuming d.c. power.

Since, initially, the accessed memory cell had no charge stored, it has now been returned to the state it was prior to the sensing operation, that is, the information has been rewritten back into the accessed memory cell. The accessed word line is returned to ground potential, turning the memory cell device off. The $V_{LH}$ is also returned to ground potential, turning device 32 off. With one bit/sense line (18A) at ground potential and the other bit/sense line (18B) at a high potential, the $V_{RD}$ line is activated turning device 34 on.

Charge redistribution takes place between the capacitance of the two bit/sense lines (18A & 18B) through devices 38A, 34 and 38B. The potential on line 18B drops to half its former value and the potential on line 18A rises to the same half value. The dummy cell storage capacitor 36B now has half the charge or half the potential of a regular memory cell. The dummy word line is returned to zero volts, turning dummy memory device 22B off. Device 34 is also turned off. Dropping the potential on the bit/sense line that remained high is desirable for another purpose. Placing both bit/sense lines at the same level ensures that during the following precharge cycle devices 38A and 38B will be driven to the same cutoff state. The $V_R$ line may or may not be returned to zero volts (devices 38A and 38B may be left on). The cycle has ended with the accessed nad dummy memory cells having been returned to their initial state, i.e., the stored information has been placed back in the cell.

If the accessed memory cell had had a high level stored ("1"), then the potential of the bit/sense line would have remained unchanged after the accessed word line was activated. Of course, then device 38A would have remained near to its close-to-cutoff state and little or no charge transfer would have taken place between node 16A and bit/sense line 18A. Therefore, node 16A would have had a higher potential than node 16B and the latch would have set in the opposite state, i.e., device 28 off and device 30 on. Bit/sense line 18A would have remained high. The cycle would then continue as before with the high level written back into the accessed memory cell.

It should be appreciated that in a different embodiment it is not necessary to pulse the $V_R$ line. In the present embodiment, the $V_R$ line was pulsed to provide a voltage boost (higher potential) at nodes 16A and 16B through capacitors 42A and 42B. A similar boost could have been provided by separating capacitors 42A and 42B from the $V_R$ line. The capacitors could have been pulsed separately while the $V_R$ line was held at a constant d.c. potential. Also, to achieve a higher potential at these nodes, it is possible to charge them to a higher value through devices 24A and 24B, thus eliminating the need for capacitors 42A and 42B altogether. The $V_R$ line can then have a d.c. potential level on it.

Pulsing the $V_R$ line has the desirable effect of stopping the transfer of charge after a sufficient offset has been developed at nodes 16A and 16B. However, pulsing this line may have other undesirable effects such as overshoot noise. To stop the transfer of charge with less adverse effects would be to raise the bit/sense line potential at the desired time. This causes the transfer device 38A or 38B to cut off without loss of the offset developed at nodes 16A and 16B.

An additional method of operation is to adjust the $V_R$ potential level so that the bit/sense lines charge to a potential mid-way between a stored "1" and a stored "0" level. For this case, dummy cells are no longer needed to establish the reference level. The reference level is established by taking advantage of an incomplete precharge, that is, the precharge period is terminated prematurely by deenergizing the $V_p$ line. Charge transfer devices 38A, 38B are left sufficiently on to cause charge to transfer from the latch nodes to the bit/sense lines. Upon termination of the precharge period, a word line is activated and depending on the stored information, the bit/sense line will either rise in potential or decrease in potential. A rise in potential will cause the charge transfer device 38A (or 38B as the case may be) to cut off more, slowing down the transfer of charge compared to the other side causing an offset to be developed at the latching circuit nodes. A drop in potential on the bit/sense line will cause the charge transfer device to turn on more, speeding up the transfer of charge causing an offset of opposite polarity to be developed at the latching circuit nodes. The operation would then continue as previously described.

After the offset is developed at the nodes both bit/sense lines are raised to the stored "1" level through external devices connected to the bit/sense lines which are momentarily turned on. The dynamic latching circuit is then set as previously described. It would be more advantageous in this mode of operation to start both bit/sense lines from ground potential. Therefore device 34 is not needed and two additional devices are used to discharge the bit/sense lines before start of the next cycle.

What has been described is an improved differential charge transfer amplifier which functions as a sensing and regenerating circuit for use with stored charge memory cells. The amplifier consumes no d.c. power with the exception of leakage power, is highly sensitive, and employs only 10 actuable devices.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A charge transfer sensing circuit for sensing information in the form of stored charge comprising,
a sense amplifier having first and second input connections, and
a pair of bit line elements having bit line capacitance respectively electrically coupled to said first and second input connections, said bit line elements being adapted to be responsive to memory cells of a stored charge memory array,
said sense amplifier including a dynamic latching circuit incorporating an array of first, second and third actuable devices for setting said latching circuit in a first or a second output voltage state for sensing information on said bit lines, and a pair of preamplification means respectively including one of fourth and fifth actuable devices, each of said preamplification means respectively connected to said first and to said second actuable devices at either side of said dynamic latching means and also respectively connected to said bit line elements, each of said preamplification means including charge storing capacitance devices for cooperating with said bit line capacitance for producing a charge transfer function for conditioning said latching circuit to be set in said first or second output voltage state wherein one of said first and second actuable devices of said latching circuit are on and the other is off, means for producing a precharge signal having a given duration, said precharge signal means being connected to said forth and fifth actuable devices of said preamplification means by turning on said fourth and fifth actuable devices, said fourth and fifth actuable devices turning off after said precharge transfer function ceases, a sixth actuable device connected to said first and second actuable devices of said latching circuit and said fourth and fifth actuable devices of said pair of preamplification means, a seventh end eighth actuable device respectively included in said pair of preamplification means, said seventh and eight actuable devices being responsive to and turned on by said precharge signal and remaining on after said bit lines have been sensed,
and a voltage signal source connected to said sixth actuable device for turning said sixth actuable device on after said bit lines have been sensed.

2. A charge transfer sensing circuit according to claim 1 wherein said array of actuable devices of said dynamic latching circuit includes first and second cross-coupled actuable devices respectively connected to said fourth and fifth actuable devices in said pair of preamplification means and a third actuable device connected to said first and second actuable devices,
said first and second actuable devices being responsive to signals on said bit line elements to selectively turn on and off to represent said first and second latching circuit states of said dynamic latching circuit, and said third actuable device functioning as a setting means for said first and second actuable devices.

3. A charge transfer sensing circuit according to claim 1 wherein said array of actuable devices of said dynamic latching circuit includes first and second cross-coupled actuable devices connected to said pair of preamplification means and a third actuable device connected to said first and second actuable devices, said first and second actuable devices being conditioned by signals on said bit line elements through said preamplification means to set said dynamic latching circuit in a first or a second voltage state, and said third actuable device functioning as a setting means for said first and second actuable devices.

4. A charge transfer sensing circuit according to claim 1 wherein said sixth actuable device in said sense amplifier functions as a restore means for said preamplification means.

5. A charge transfer sensing circuit according to claim 1 wherein each of one of said pair of preamplification means including respectively said fourth and fifth actuable devices which function as precharge actuable devices connected to said dynamic latching means, and wherein each one of said preamplification means further includes a charge transfer actuable device also connected to said dynamic latching means, said precharge actuable device and said charge transfer actuable device of each of said preamplification means functioning to apply electrical signal to said dynamic latching means.

6. A charge transfer sensing circuit according to claim 1 wherein each one of said pair of preamplification means includes a precharge actuable device connected to said dynamic latching means, a charge transfer actuable device also connected to said dynamic latching means, and a pair of charge redistribution capacitors connected to said charge transfer actuable device.

said precharge actuable device and said charge transfer actuable device of each of said preamplification means functioning to apply electrical signal to said dynamic latching means, and said pair of charge redistribution capacitors of each of said preamplification means functioning to vary the voltage level applied to said dynamic latching means.

7. A charge transfer sensing circuit according to claim 1 further including a dummy memory cell connected to each of said bit line elements, each of said dummy memory cells including an actuable device connected to a capacitance means and functioning to provide a stored voltage to establish a reference level for said dynamic latching circuit, and wherein each of said dummy memory cells are returned to their initial state after the sensing operation through said associated preamplification means.

* * * * *